US012568834B2

(12) United States Patent
Konstadinidis et al.

(10) Patent No.:    US 12,568,834 B2
(45) Date of Patent:         Mar. 3, 2026

(54) ACTIVE SILICON D2D BRIDGE

(71) Applicant: Google LLC, Mountain View, CA (US)

(72) Inventors: Georgios Konstadinidis, San Jose, CA (US); Woon-Seong Kwon, Santa Clara, CA (US); Jaesik Lee, Santa Clara, CA (US); Teckgyu Kang, Saratoga, CA (US); Jin Y. Kim, Mountain View, CA (US); Sukalpa Biswas, Fremont, CA (US); Biao He, Sunnyvale, CA (US); Yujeong Shim, Cupertino, CA (US)

(73) Assignee: Google LLC, Mountain View, CA (US)

( * ) Notice: Subject to any disclaimer, the term of this patent is extended or adjusted under 35 U.S.C. 154(b) by 880 days.

(21) Appl. No.: 17/841,188

(22) Filed: Jun. 15, 2022

(65) Prior Publication Data

US 2023/0411297 A1        Dec. 21, 2023

(51) Int. Cl.
| | |
|---|---|
| *H01L 23/538* | (2006.01) |
| *H01L 21/48* | (2006.01) |
| *H01L 25/00* | (2006.01) |
| *H01L 25/065* | (2023.01) |
| *H01L 25/18* | (2023.01) |

(52) U.S. Cl.
CPC ...... *H01L 23/5381* (2013.01); *H01L 21/4853* (2013.01); *H01L 21/486* (2013.01); *H01L 23/5384* (2013.01); *H01L 23/5385* (2013.01); *H01L 25/0655* (2013.01); *H01L 25/18* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 7,969,009 | B2 | 6/2011 | Chandrasekaran |
| 8,227,904 | B2 | 7/2012 | Braunisch et al. |
| 8,946,900 | B2 | 2/2015 | Qian et al. |
| 9,589,866 | B2 | 3/2017 | Chiu et al. |
| 9,595,495 | B1 | 3/2017 | Patil |
| 10,163,798 | B1 | 12/2018 | Alur et al. |

(Continued)

OTHER PUBLICATIONS

Extended European Search Report for European Patent Application No. 22207530.1 dated Jun. 19, 2023. 13 pages.

*Primary Examiner* — Long Pham
(74) *Attorney, Agent, or Firm* — Lerner David LLP

(57)        ABSTRACT

A microelectronic system may include a substrate having a first surface, one or more interposers mounted to and electrically connected to the first surface, first and second application specific integrated circuits (ASICs) each at least partially overlying and electrically connected to one of the interposers, a plurality of high-bandwidth memory elements (HBMs) each at least partially overlying and electrically connected to one of the interposers, and an active silicon bridge mounted to and electrically connected to the first surface and providing an electrical connection between the first and second ASICs, the active silicon bridge having active microelectronic devices therein. The microelectronic system may be configured such that the first and second ASICs and the active silicon bridge each have a purely digital CMOS interface therein. A plurality of bumps providing the electrical connection between the ASICs and the active silicon bridge may be configured to receive serial data therethrough.

11 Claims, 5 Drawing Sheets

(56)                    References Cited

U.S. PATENT DOCUMENTS

| | | | |
|---|---|---|---|
| 10,229,882 | B2 | 3/2019 | Deshpande et al. |
| 10,373,893 | B2 | 8/2019 | Vaidya et al. |
| 10,861,830 | B2 | 12/2020 | Yeh et al. |
| 10,923,429 | B2 | 2/2021 | Braunisch et al. |
| 10,991,635 | B2 | 4/2021 | McHerron et al. |
| 11,133,256 | B2 | 9/2021 | Jain et al. |
| 11,270,941 | B2 | 3/2022 | Seidemann et al. |
| 11,302,644 | B2 | 4/2022 | Lu |
| 2017/0110407 | A1* | 4/2017 | Chaware ................. H01L 24/13 |
| 2018/0181524 | A1 | 6/2018 | Schulz et al. |
| 2019/0206798 | A1 | 7/2019 | Collins et al. |
| 2019/0319626 | A1 | 10/2019 | Dabral et al. |
| 2020/0144186 | A1 | 5/2020 | Thomas et al. |
| 2020/0243486 | A1 | 7/2020 | Quader et al. |
| 2020/0266074 | A1 | 8/2020 | Chang et al. |
| 2021/0082819 | A1 | 3/2021 | Wu et al. |
| 2021/0202396 | A1* | 7/2021 | Wu ..................... H01L 23/5383 |
| 2024/0213166 | A1* | 6/2024 | You ..................... H01L 23/3185 |

* cited by examiner

FIG. 8

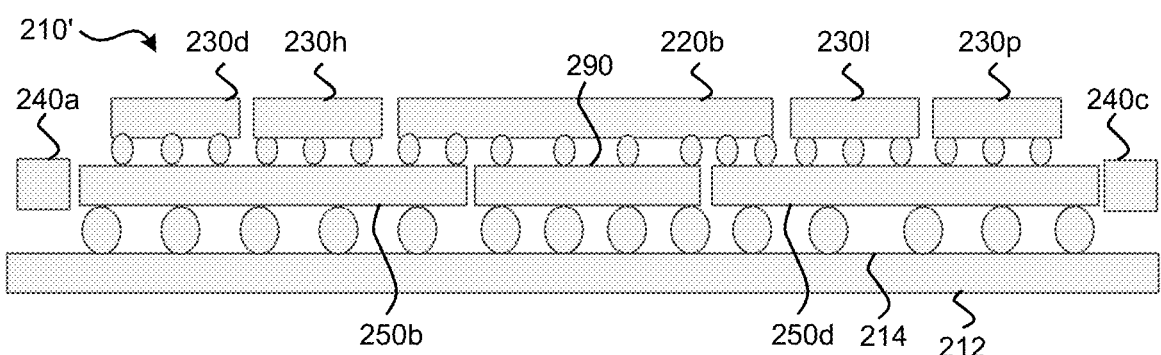

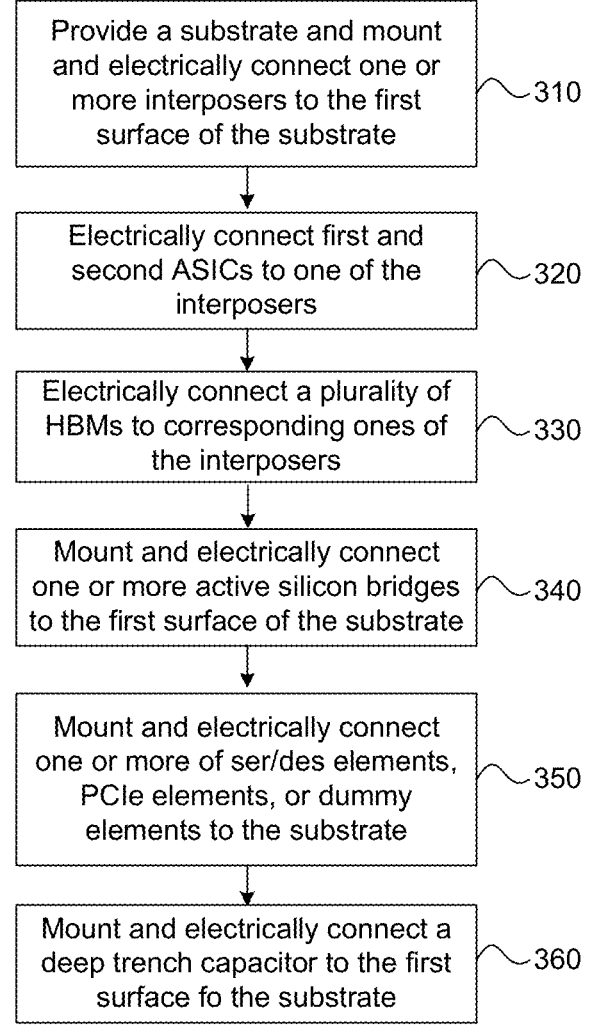

Provide a substrate and mount and electrically connect one or more interposers to the first surface of the substrate — 310

Electrically connect first and second ASICs to one of the interposers — 320

Electrically connect a plurality of HBMs to corresponding ones of the interposers — 330

Mount and electrically connect one or more active silicon bridges to the first surface of the substrate — 340

Mount and electrically connect one or more of ser/des elements, PCIe elements, or dummy elements to the substrate — 350

Mount and electrically connect a deep trench capacitor to the first surface fo the substrate — 360

ACTIVE SILICON D2D BRIDGE

BACKGROUND

Die-to-die (D2D) interfaces are a component in enabling the continued increase in integrated circuit transistor density by integrating chiplets in a system-on-a-chip (SOC) configuration. D2D requirements include a high bandwidth per millimeter connection width, low power, and use of a standard protocol. The large bump pitch and reduced number of wires in conventional D2D interfaces results in use of high bit rates per wire to achieve the required bandwidth. Use of finite impulse response (FIR), continuous time linear equalizers (CTLE), and decision feedback equalization (DFE) that add complexity, power and area are solutions typically becoming available at more mature processes and not at the process development stage. For example, the currently available solutions involve a long channel that has a lot of attenuation and ISI (Intersymbol Interference) distortion that requires special signal equalization techniques like FIR, CTLE, and DFE, which are complex designs available at later states of process maturity.

BRIEF SUMMARY

The present disclosure solves the problems of conventional systems by effectively reducing the channel length from tens of millimeters to a few micrometers, the length of the bumps eliminating the need for conventional complex techniques, thereby simplifying the design and accelerating time to market.

One aspect of the disclosure provides a microelectronic system. The microelectronic system may have a substrate having a first surface, one or more interposers mounted to and electrically connected to the first surface, first and second application specific integrated circuits (ASICs) each at least partially overlying and electrically connected to one of the interposers, a plurality of high-bandwidth memory elements (HBMs) each at least partially overlying and electrically connected to one of the interposers, and an active silicon bridge mounted to and electrically connected to the first surface and providing an electrical connection between the first and second ASICs, the active silicon bridge having active microelectronic devices therein. Each of the one or more interposers may have electrically conductive vias extending therethrough. The microelectronic system may be configured such that the first and second ASICs and the active silicon bridge each have a parallel or purely digital CMOS interface therein. A plurality of bumps providing the electrical connection between the ASICs and the active silicon bridge may be configured to receive serial data therethrough.

The active silicon bridge may have a plurality of parallel connections therein extending between a first plurality of flip-flops and a second plurality of flip-flops. The parallel connections may be configured to have a bandwidth of 2 Gbps per lane. The first and second ASICs and the active silicon bridge each may include a serializer and a de-serializer. Each serializer may be 16:1 and each de-serializer may be 1:16, such that the bumps are configured to have a serial data rate of 32 Gbps through the bumps, which is configured to be converted to a parallel interface of 2 Gbps within the first and second ASICs and within the active silicon bridge. The microelectronic system may include a serializer/de-serializer element at least partially overlying and electrically connected to one of the interposers. The microelectronic system may include a PCIe (peripheral component interconnect express) element at least partially overlying and electrically connected to one of the interposers.

The active silicon bridge may have an HBM controller functionality that is configured to control operation of the HBMs. The active silicon bridge may have a repeater functionality that is configured to repeat electrical signals within the active silicon bridge. The active silicon bridge may be a first active silicon bridge. The microelectronic system may include a second active silicon bridge mounted to and electrically connected to the first surface and providing an electrical connection between the first and second ASICs, the second active silicon bridge having active microelectronic devices therein. The microelectronic system may include a deep trench capacitor mounted to and electrically connected to the first surface. The deep trench capacitor may be electrically connected to at least one of the first and second ASICs.

Another aspect of the disclosure provides for a method of assembling a microelectronic system. The method may include providing a substrate having a first surface, mounting and electrically connecting one or more interposers to the first surface, electrically connecting first and second application specific integrated circuits (ASICs) to one of the interposers, electrically connecting each of plurality of high-bandwidth memory elements (HBMs) to one of the interposers, and mounting and electrically connecting an active silicon bridge to the first surface.

Each of the one or more interposers may have electrically conductive vias extending therethrough. Each of the first and second ASICs may at least partially overlie the respective one of the interposers. Each of the HBMs may at least partially overlie the respective one of the interposers. The active silicon bridge may provide an electrical connection between the first and second ASICs, the active silicon bridge having active microelectronic devices therein. The microelectronic system may be configured such that the first and second ASICs and the active silicon bridge each have a parallel or purely digital CMOS interface therein. A plurality of bumps providing the electrical connection between the ASICs and the active silicon bridge may be configured to receive serial data therethrough.

The active silicon bridge may have a plurality of parallel connections therein extending between a first plurality of flip-flops and a second plurality of flip-flops. The parallel connections may be configured to have a bandwidth of 2 Gbps per lane. The first and second ASICs and the active silicon bridge each may include a serializer and a de-serializer. Each serializer may be 16:1 and each de-serializer may be 1:16, such that the bumps are configured to have a serial data rate of 32 Gbps through the bumps, which is configured to be converted to a parallel interface of 2 Gbps within the first and second ASICs and within the active silicon bridge.

The active silicon bridge may have an HBM controller functionality that is configured to control operation of the HBMs. The active silicon bridge may have a repeater functionality that is configured to repeat electrical signals within the active silicon bridge. The active silicon bridge may be a first active silicon bridge. The method may include mounting and electrically connecting a second active silicon bridge to the first surface. The second active silicon bridge may provide an electrical connection between the first and second ASICs. The second active silicon bridge may have active microelectronic devices therein. The method may include mounting and electrically connecting a deep trench capacitor to the first surface. The deep trench capacitor may be electrically connected to at least one of the first and second ASICs.

BRIEF DESCRIPTION OF THE DRAWINGS

FIG. 8 shows a sectional view of a microelectronic system having an active silicon bridge therein, in accordance with aspects of the disclosure.

FIG. 9 is a flow chart illustrating an example method in accordance with one aspect of the disclosure.

DETAILED DESCRIPTION

The present disclosure provides for an active silicon bridge D2D interface that eliminates the need of a long channel, special protocol, FIR (finite impulse response), CTLE (continuous time linear equalization), DFE (decision feedback equalization), complexity, and is available as a pure digital interface during process development. This solution may provide for high robustness, less complexity, faster development, and a shorter time to market.

With an active silicon bridge according to this disclosure, the serial channel length reduces to be equal to the thickness of the bumps providing the electrical connection to the bridge. Consequently, a high bit rate occurs only across the bumps, while elsewhere a parallel interface is used at lower frequencies, and there may be standard on-chip signal propagation using flops and repeaters. The active silicon bridge may behave like a normal chip with all transistors and the full wire stack available in a process node, as opposed to only a few metal layers as is the case with silicon interposers.

Figures 1, 2:
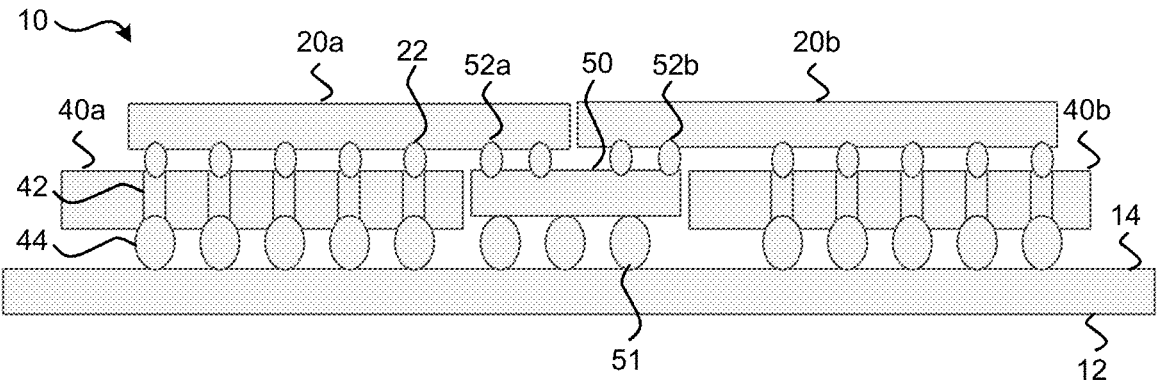
FIG. 1 shows a sectional view of a microelectronic system having an active silicon bridge therein, in accordance with aspects of the disclosure.
FIG. 2 shows a top plan view of the microelectronic system of FIG. 1.
Figure 3:
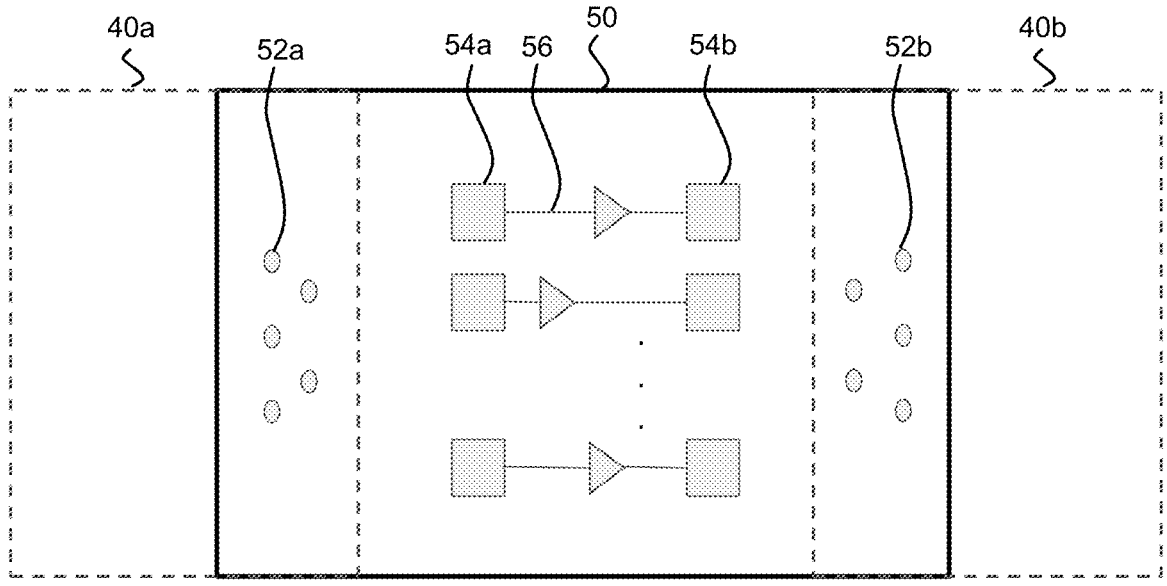
FIG. 3 shows an enlarged top plan view of the active silicon bridge of FIG. 1.

Referring to FIGS. 1-3, an example microelectronic system 10 includes a substrate 12 that may be configured to be electrically connected with a component external to the system. The substrate 12 may be a dielectric element such as an FR-4 (glass-reinforced epoxy resin laminate) circuit panel, for example. The substrate 12 may alternatively be made of or may include another dielectric material such as glass or epoxy, or the substrate may be made of or include a semiconductor material such as silicon, germanium, or gallium arsenide.

The system 10 includes one or more application specific integrated circuits (ASICs) shown in FIGS. 1 and 2 as a north ASIC 20a and a south ASIC 20b. The system 10 may include a plurality of high-bandwidth memory elements (HBMs) 30, shown in FIG. 2 as HBMs through 30h.

The system 10 may include one or more interposers 40, shown in FIGS. 1 and 2 as interposers 40a and 40b. The interposers may each have a substrate made of a dielectric or semiconductor material, for example. The interposers 40 may have vias 42 extending therethrough to provide electrical connections between the ASICs 20 and a first surface 14 of the substrate 12 and between the HBMs 30 and the first surface of the substrate.

Each of the interposers 40 may be flip-chip mounted to the first surface 14 of the substrate 12, and may be electrically connected with conductive elements at the first surface via bumps 44, which may be electrically conductive masses such as solder.

The system 10 may include an active silicon bridge 50 that is configured to provide high-bandwidth communication between the north ASIC 20a and the south ASIC 20b, and/or between the ASICs 20 and the HBMs 30. The bridge 50 is a semiconductor element having active microelectronic devices therein. The bridge 50 may have a semiconductor substrate and dielectric passivation layers overlying top and bottom major planar surfaces thereof, for example. The bridge 50 may be flip-chip mounted to the first surface 14 of the substrate 12, and may be electrically connected with conductive elements at the first surface via bumps 51, which may be electrically conductive masses such as solder.

As can be seen in FIG. 3, the bridge 50 may be electrically connected to the ASICs via the bumps 52, shown as the bumps 52a that are electrically connected to the north ASIC and the bumps 52b that are electrically connected to the south ASIC 20b. The bumps 52 may be electrically conductive masses such as solder. The bumps 52 and all of the other bumps described herein may be microbumps having a minimum pitch between adjacent microbumps of about 40-50 microns. The bridge 50 may have a plurality of parallel connections 56 extending between a first plurality of flip-flops 54a and a second plurality of flip-flops 54b. The parallel connections 56 may be configured to have a bandwidth of 2 Gbps per lane. In other examples, the parallel connections 56 may be configured to have higher bandwidths, such as 4 Gbps per lane or 8 Gbps per lane.

The flip-flops 54a and 54b are storage elements, and the parallel connections 56 include CMOS (complementary metal oxide semiconductor) active repeaters. The parallel interface within the bridge 50 may be implemented similar to an on-chip wide bus interconnect interface. To avoid distortion and reduction in amplitude, the parallel connections 56 may include active repeater circuits that consist of CMOS inverters or buffers and flip-flops. This cannot be done with conventional silicon interposers (CoWos), because such interposers do not have active circuitry therein. To include active devices in conventional silicon interposers would be cost prohibitive due to the very large die in CoWos elements. In contrast, the bridge 50 of the system 10 is very small, so it is much more economical to include active circuitry in the bridge.

With the bridge 50, the system 10 may permit a purely digital CMOS interface on both the ASIC and bridge side, instead of having a serial interface between the ASICs. The ASICs 20 and the bridge 50 may each contain serializer and de-serializer functionality, so that each of the ASICs and the bridge may have a purely digital CMOS interface therein. Each serializer can be 16:1, and each de-serializer may be 1:16, such that the bumps 52a and 52b may each have a serial data rate of 32 Gbps through the bumps, which is converted to a parallel interface of 2 Gbps within the ASICs 20 and within the bridge 50. In other examples, other serializer/de-serializer ratios and data rates may be used, such as a 32:1 serializer and a 1:32 de-serializer, a serial rate of 64 Gbps through the bumps, and a parallel interface of 2

Gbps within the ASICs 20 and the bridge 50. In another example, an 8:1 serializer and a 1:8 de-serializer could be used, with a serial rate of 32 Gbps through the bumps, and a parallel interface of 4 Gbps within the ASICs 20 and the bridge 50. These are merely examples of serializer/de-serializer ratios, data rates, and parallel interface speeds that may be used. Higher data rates may be implemented due to the very short serial channels through the bumps 52.

Each of the ASICs 20 may be flip-chip mounted to a corresponding one of the interposers 40 via bumps 22, which may be electrically conductive masses such as solder, and also to the bridge 50 via the bumps 52.

The system 10 may include dummy elements 60, which can be seen in FIG. 2. The dummy elements 60 may each be made of a dielectric or semiconductor material, for example. The dummy elements 60 may provide additional structural support to the other elements of the system 10 that may partially overlie the interposers 40 and/or the bridge 50. In an alternative example, the dummy elements 60 may be omitted, and the bridge 50 may be extended to occupy the space occupied by the dummy elements in FIG. 2.

Figures 4, 5:
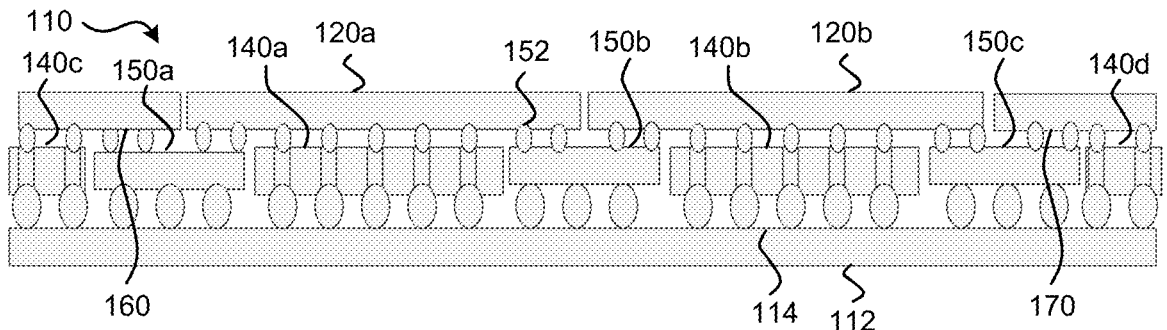
FIG. 4 shows a sectional view of a microelectronic system having an active silicon bridge therein, in accordance with aspects of the disclosure.
FIG. 5 shows a top plan view of the microelectronic system of FIG. 4.

Now referring to FIGS. 4 and 5, an example microelectronic system 110 is shown that is a variation of the system 10. The system 110 includes a substrate 112 that may be configured to be electrically connected with a component external to the system, one or more application specific integrated circuits (ASICs) 120, shown as a north ASIC 120a and a south ASIC 120b, and a plurality of high-bandwidth memory elements (HBMs) 130, shown as HBMs 130a through 130h.

The system 110 may include one or more interposers 140, shown as interposers 140a through 140d. The interposers 140 may provide electrical connections between the ASICs 120 and a first surface 114 of the substrate 112 and between the HBMs 130 and the first surface of the substrate.

The system 110 may include a plurality of active silicon bridges 150 that are each configured to provide high-bandwidth communication between the north ASIC 120a and the south ASIC 120b, and/or between the ASICs 120 and the HBMs 130. The bridges 150 may each be flip-chip mounted to the first surface 114 of the substrate 112. Each of the bridges 150 may have a similar structure and function as the bridge 50 shown in FIG. 3.

With the bridges 150, the system 110 may permit a purely digital CMOS interface on both the ASIC and bridge side. The ASICs 120 and the bridges 150 may each contain serializer and de-serializer functionality, so that each of the ASICs and the bridge may have a purely digital CMOS interface therein. Each serializer can be 16:1, and each de-serializer may be 1:16, such that the bumps 152 may each have a serial data rate of 32 Gbps through the bumps, which is converted to a parallel interface of 2 Gbps within the ASICs 120 and within the bridges 150. In other examples, other serializer/de-serializer ratios and data rates may be used, such as a 32:1 serializer and a 1:32 de-serializer, a serial rate of 64 Gbps through the bumps, and a parallel interface of 2 Gbps within the ASICs 120 and the bridges 150. In another example, an 8:1 serializer and a 1:8 de-serializer could be used, with a serial rate of 32 Gbps through the bumps, and a parallel interface of 4 Gbps within the ASICs 120 and the bridges 150. These are merely examples of serializer/de-serializer ratios, data rates, and parallel interface speeds that may be used. Higher data rates may be implemented due to the very short serial channels through the bumps 152.

The system 110 may include a serializer/de-serializer element 160. The element 160 may be electrically connected to one of the bridges 150. The element 160 may handle some or all of the serializer and de-serializer functionality for the system 110.

The system 110 may include a peripheral component interconnect express (PCIe) element 170. The element 170 may have one of various purposes, including one or more of graphics, memory, and storage. For example, the PCIe element may be a graphics adapter card, a network interface card (NIC), a storage accelerator device, or another high-performance peripheral. The elements 160 and/or 170 may alternatively be other chiplets including but not limited to a high speed serializer/de-serializer element, additional HBMs, or other examples.

The system 110 may include dummy elements 180, which can be seen in FIG. 5. The dummy elements 180 may provide additional structural support to the other elements of the system 110 that may partially overlie the interposers 140 and/or the bridges 150. In an alternative example, one or more of the dummy elements 180 may be omitted, and one or more of the bridges 150 may be extended to occupy the space occupied by the dummy elements in FIG. 5.

Figure 6:
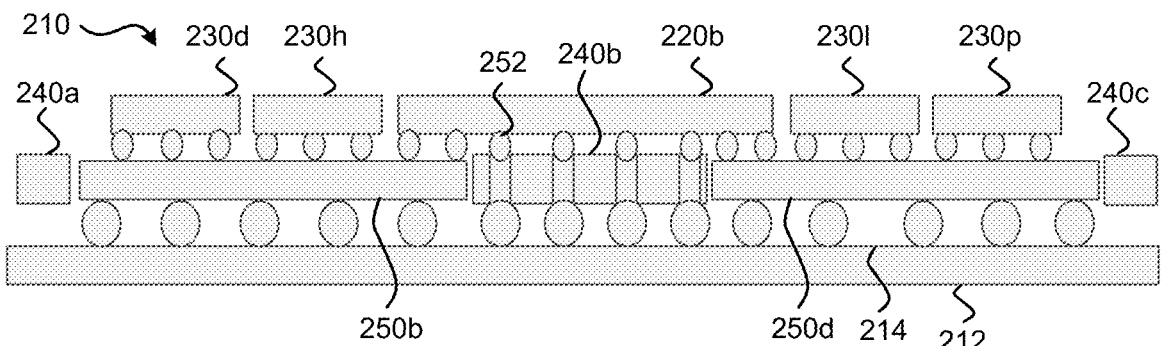
FIG. 6 shows a sectional view of a microelectronic system having an active silicon bridge therein, in accordance with aspects of the disclosure.
Figure 7:
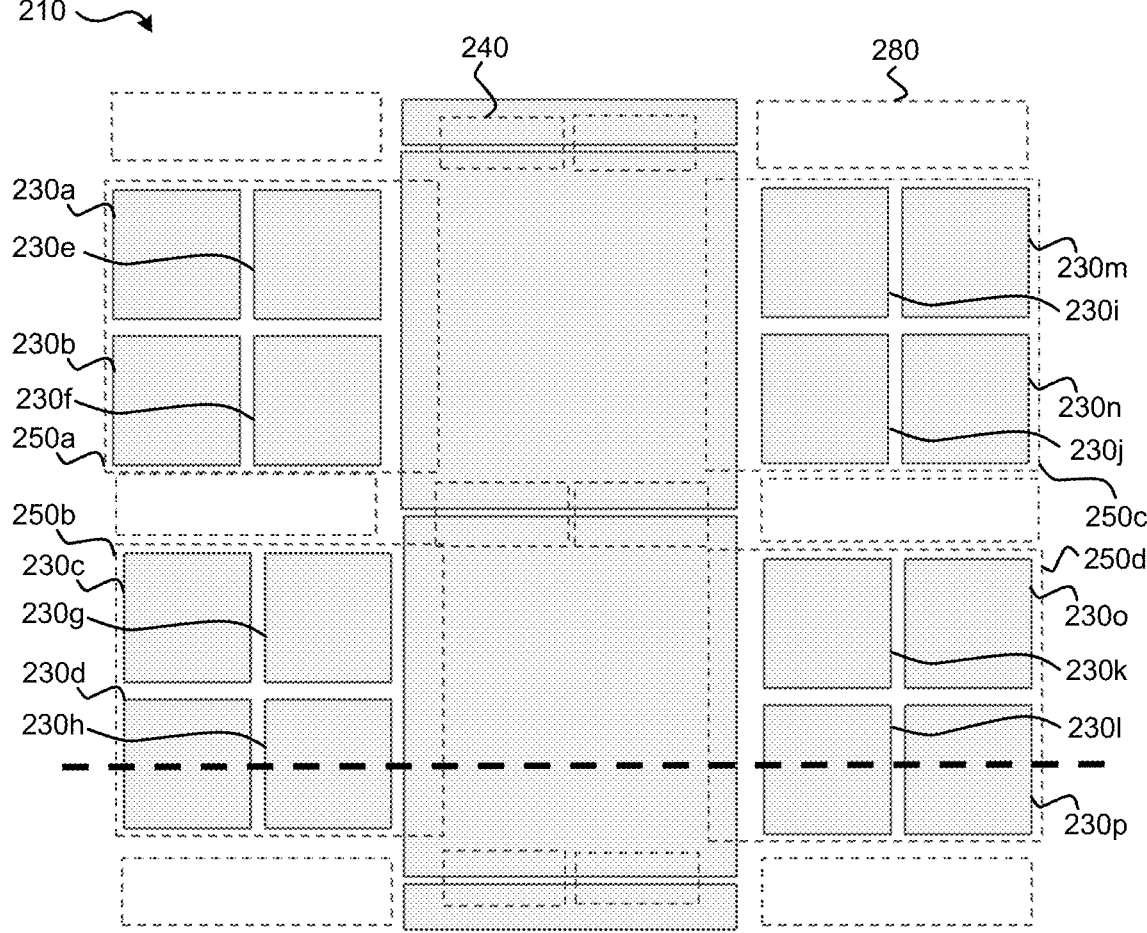
FIG. 7 shows a top plan view of the microelectronic system of FIG. 6.

Now referring to FIGS. 6 and 7, an example microelectronic system 210 is shown that is another variation of the system 10. The system 210 includes a substrate 212 that may be configured to be electrically connected with a component external to the system, one or more application specific integrated circuits (ASICs) 220, shown as a north ASIC 220a and a south ASIC 220b, and a plurality of high-bandwidth memory elements (HBMs) 230, shown as HBMs 230a through 230p.

The system 210 may include one or more interposers 240, shown as interposers 240a through 240c. The interposers 240 may provide electrical connections between the ASICs 220 and a first surface 214 of the substrate 212 and between the HBMs 230 and the first surface of the substrate.

The system 210 may include a plurality of active silicon bridges 250 that are each configured to provide high-bandwidth communication between the north ASIC 220a and the south ASIC 220b, and/or between the ASICs 220 and the HBMs 230. The bridges 250 may each be flip-chip mounted to the first surface 214 of the substrate 212. Each of the bridges 250 may have a similar structure and function as the bridge 50 shown in FIG. 3. One or more of the bridges 250 may have an HBM controller functionality that is configured to control operation of the HBMs 230. One or more of the bridges 250 may have a repeater functionality that is configured to repeat electrical signals within the bridges, to minimize the interconnect response time by mitigating the effect of resistance and capacitance.

With the bridges 250, the system 210 may permit a purely digital CMOS interface on both the ASIC and bridge side. The ASICs 220 and the bridges 250 may each contain serializer and de-serializer functionality, so that each of the ASICs and the bridge may have a purely digital CMOS interface therein. Each serializer can be 16:1, and each de-serializer may be 1:16, such that the bumps 252 may each have a serial data rate of 32 Gbps through the bumps, which is converted to a parallel interface of 2 Gbps within the ASICs 220 and within the bridges 250.

The system 210 may include dummy elements 280, which can be seen in FIG. 7. The dummy elements 280 may provide additional structural support to the other elements of the system 210 that may partially overlie the interposers 240 and/or the bridges 250. In an alternative example, one or more of the dummy elements 280 may be omitted, and one or more of the bridges 250 may be extended to occupy the space occupied by the dummy elements in FIG. 7.

Now referring to FIG. 8, an example microelectronic system 210' is shown that is a variation of the system 210. The system 210' is the same as the microelectronic system 210, except that one of the interposers (240b) is replaced by a deep trench capacitor element (DTC) 290, to add capacitance to the system, providing higher capacitance per unit area over other capacitance solutions. In other examples, other elements may be used to add capacitance to the system, such as a metal-insulator-metal capacitor (MIM cap).

Now referring to FIG. 9, a method of assembling a microelectronic system will be described. The following operations do not have to be performed in the precise order described below. Rather, various operations can be handled in a different order or simultaneously, and operations may also be added or omitted. FIG. 9 illustrates a flow chart 300 showing an example assembly method for the microelectronic system 10, 110, 210, or 210'.

In block 310, a substrate 12 may be provided, and one or more interposers 40 may be mounted and electrically connected to the first surface 14 of the substrate. In block 320, first and second ASICs 20a, 20b may be electrically connected to one of the interposers 40, each of the first and second ASICs at least partially overlying the respective one of the interposers.

In block 330, each of a plurality of HBMs 30a-30h may be electrically connected to one of the interposers 40, each of the HBMs at least partially overlying the respective one of the interposers. In block 340, an active silicon bridge 50 may be mounted and electrically connected to the first surface, the active silicon bridge providing an electrical connection between the first and second ASICs 20a, 20b via a respective plurality of bumps 50a, 50b.

In some examples, (e.g., FIGS. 4 and 5) the active silicon bridge may be a first active silicon bridge 150a, and block 340 may also include mounting and electrically connecting a second active silicon bridge 150b to the first surface, the second active silicon bridge providing an electrical connection between the first and second ASICs 120a, 120b.

In some examples, (e.g., FIGS. 4 and 5) method may include block 350, in which one or more of serializer/de-serializer elements 160, a peripheral component interconnect express (PCIe) elements 170, or dummy elements 180 may be mounted and electrically connected to the first surface 114 of the substrate 112.

In some examples, (e.g., FIG. 8), the method may include block 360, in which a deep trench capacitor 290 may be mounted and electrically connected to the first surface 214 of the substrate 212, the deep trench capacitor being electrically connected to at least one of the first and second ASICs 220a, 220b.

The design of the microelectronic systems 10, 110, 210, and 210' shown in FIGS. 1-8 are just a few examples of the microelectronic system. Other microelectronic systems are contemplated, such as systems having different numbers of ASICs, HBM elements, interposers, active silicon bridges, dummy elements, serializer/de-serializer elements, PCIe elements, and DTC elements. For example, the microelectronic systems 10, 110, 210, and 210' may each include 4, 8, 12, 16, 24, or 32 HBM elements, among others.

Although all elements are shown in the figures as being flip-chip mounted to one another and to the substrate 12, 112, and 212, in other examples, the substrate may have bond windows extending therethrough, and the mounted elements may be wire-bonded to the substrate through the bond windows. Although the bond metals used in FIGS. 1-8 are shown as solder bumps, this need not be the case. In other examples, other electrically conductive bond materials may be used (e.g., a conductive matrix material), or rigid conductive pillars may be used to provide an electrical connection between one or more of the elements and the substrate.

The microelectronic systems 10, 110, 210 disclosed herein may be used in various electronic systems. For example, the substrate 12, 112, and 212 may be module cards or module substrates that are configured to be mounted to a motherboard of an electronic device such as a personal computer or a cellular phone, among others.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A microelectronic system, comprising:
   a substrate having a first surface;
   one or more interposers mounted to and electrically connected to the first surface, each of the one or more interposers having electrically conductive vias extending therethrough;
   first and second application specific integrated circuits (ASICs) each at least partially overlying and electrically connected to one of the interposers;
   a plurality of high-bandwidth memory elements (HBMs) each at least partially overlying and electrically connected to one of the interposers;
   an active silicon bridge mounted to and electrically connected to the first surface and providing an electrical connection between the first and second ASICs, the active silicon bridge having active microelectronic devices therein,
   wherein the microelectronic system is configured such that the first and second ASICs and the active silicon bridge each have a parallel interface therein, and a plurality of bumps providing the electrical connection between the ASICs and the active silicon bridge are configured to receive serial data therethrough such that the electrical connection between the ASICs and the active silicon bridge has a channel length that is substantially equal to the thickness of the bumps.

2. The microelectronic system of claim 1, wherein the active silicon bridge has a plurality of parallel connections therein extending between a first plurality of flip-flops and a second plurality of flip-flops.

3. The microelectronic system of claim 2, wherein the parallel connections are configured to have a bandwidth of 2 Gbps per lane.

4. The microelectronic system of claim 1, wherein the first and second ASICs and the active silicon bridge each include a serializer and a de-serializer.

5. The microelectronic system of claim 4, wherein each serializer is 16:1 and each de-serializer is 1:16, such that the bumps are configured to have a serial data rate of 32 Gbps through the bumps, which is configured to be converted to a parallel interface of 2 Gbps within the first and second ASICs and within the active silicon bridge.

6. The microelectronic system of claim 1, further comprising a serializer/de-serializer element at least partially overlying and electrically connected to one of the interposers.

7. The microelectronic system of claim 1, further comprising a peripheral component interconnect express element at least partially overlying and electrically connected to one of the interposers.

8. The microelectronic system of claim 1, wherein the active silicon bridge has an HBM controller functionality that is configured to control operation of the HBMs.

9. The microelectronic system of claim 1, wherein the active silicon bridge has a repeater functionality that is configured to repeat electrical signals within the active silicon bridge.

10. The microelectronic system of claim 1, wherein the active silicon bridge is a first active silicon bridge, the microelectronic system further comprising a second active silicon bridge mounted to and electrically connected to the first surface and providing an electrical connection between the first and second ASICs, the second active silicon bridge having active microelectronic devices therein.

11. The microelectronic system of claim 1, further comprising a deep trench capacitor mounted to and electrically connected to the first surface, the deep trench capacitor being electrically connected to at least one of the first and second ASICs.

* * * * *